(12) United States Patent
Hughes et al.

(10) Patent No.: US 11,837,862 B2
(45) Date of Patent: Dec. 5, 2023

(54) ARC-FLASH SENSOR USING OPTICAL FIBER

(71) Applicant: Schweitzer Engineering Laboratories, Inc., Pullman, WA (US)

(72) Inventors: Joshua E. Hughes, Pullman, WA (US); Gerald K. Hein, Pullman, WA (US); Aaron B. Burton, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 286 days.

(21) Appl. No.: 17/066,770

(22) Filed: Oct. 9, 2020

(65) Prior Publication Data
US 2022/0115858 A1    Apr. 14, 2022

(51) Int. Cl.
| | | |
|---|---|---|
| *H02H 3/08* | (2006.01) | |
| *H02H 9/02* | (2006.01) | |
| *H02H 1/00* | (2006.01) | |
| *G02B 19/00* | (2006.01) | |
| *G01R 31/12* | (2020.01) | |
| *G02B 6/26* | (2006.01) | |

(52) U.S. Cl.
CPC ....... *H02H 1/0023* (2013.01); *G01R 31/1218* (2013.01); *G02B 6/262* (2013.01); *G02B 19/0009* (2013.01); *G02B 19/0076* (2013.01); *H02H 3/08* (2013.01)

(58) Field of Classification Search
CPC .......... H02H 1/0023; H02H 3/16; H02H 3/28; G01R 31/086; G01R 31/088
USPC ....................................................... 361/93.1
See application file for complete search history.

(56) References Cited

U.S. PATENT DOCUMENTS

| 2,612,817 A | 10/1952 | Willcox |
|---|---|---|
| 3,849,786 A | 11/1974 | Nanba |
| (Continued) | | |

FOREIGN PATENT DOCUMENTS

| EP | 0249815 | 12/1987 |
|---|---|---|
| EP | 0818075 | 1/1998 |
| (Continued) | | |

OTHER PUBLICATIONS

IEEE 1584, Guide for Performing Arc Flash Hazard Calculations, Industry Applications Society, Sep. 23, 2002.

(Continued)

*Primary Examiner* — Jared Fureman
*Assistant Examiner* — Lucy M Thomas
(74) *Attorney, Agent, or Firm* — Fletcher Yoder, P.C.

(57) ABSTRACT

An arc-flash sensor may provide flexibilities for supporting both surface mounting and peek-through mounting on a panel (e.g., a wall panel or an electrical panel). The arc-flash sensor includes a translucent optical lens, a fiber-optic cable, and a skirt around the back side of the optical lens. The translucent optical lens diffuses the light produced in an arc flash to enhance the detectability of light signals picked by the fiber-optic cable. The fiber-optic cable enters parallel to the panel and perpendicular to principal axis of the optical lens. The parallel fiber-optic cable configuration reduces sensor installation space occupied and potential damage to the sensor. The skirt is used to prevent false tripping caused by unexpected events on the fiber-optic cable side such as camera flashes, lightning, sunlight, or the like.

20 Claims, 9 Drawing Sheets

(56) References Cited

U.S. PATENT DOCUMENTS

| | | |
|---|---|---|
| 4,285,164 A | 8/1981 | Moore |
| 4,369,364 A | 1/1983 | Kuntermann |
| 4,418,338 A | 11/1983 | Burt |
| 4,422,719 A | 12/1983 | Orcutt |
| 4,516,022 A | 5/1985 | Lindgren |
| 4,614,868 A | 9/1986 | Alster |
| 4,702,553 A | 10/1987 | Buchmuller |
| 4,791,518 A | 12/1988 | Fisher |
| 4,878,144 A | 10/1989 | Nebon |
| 4,978,863 A | 12/1990 | Lyons |
| 5,170,050 A | 12/1992 | Giboulet |
| 5,208,542 A | 5/1993 | Tennies |
| 5,245,200 A | 9/1993 | Fladda |
| 5,682,101 A | 10/1997 | Brooks |
| 5,771,091 A | 6/1998 | Paritsky |
| 5,940,547 A | 8/1999 | Schumacher |
| 6,011,480 A | 1/2000 | Schweitzer |
| 6,124,706 A | 9/2000 | Woods |
| 6,229,680 B1 | 5/2001 | Shea |
| 6,292,105 B1 | 9/2001 | Land |
| D458,157 S | 6/2002 | Susal |
| 6,433,976 B1 | 8/2002 | Phillips |
| 6,476,396 B1 | 11/2002 | Forsyth |
| 6,693,438 B2 | 2/2004 | Shea |
| 6,920,028 B2 | 7/2005 | Schweitzer |
| 7,035,068 B2 | 4/2006 | Shea |
| 7,323,673 B1 | 1/2008 | Ake |
| 7,397,596 B2 | 7/2008 | Yacoubian |
| 7,526,393 B2 | 4/2009 | Thurmond |
| 7,536,914 B2 | 5/2009 | Land |
| 7,580,232 B2 | 8/2009 | Caggiano |
| 7,671,351 B2 | 3/2010 | Setlak |
| D619,480 S | 7/2010 | Kelser |
| 7,750,646 B2 | 7/2010 | Maity |
| 7,791,846 B2 | 9/2010 | Roscoe |
| 7,952,360 B2 | 5/2011 | Ganesh |
| 8,154,730 B2 | 4/2012 | Wu |
| 8,319,173 B2 | 11/2012 | Schweitzer, III |
| 8,451,572 B2 | 5/2013 | Schweitzer, III |
| 8,593,769 B2 | 11/2013 | Schweitzer, III |
| 8,664,961 B2 | 3/2014 | Zeller |
| 8,675,329 B2 | 3/2014 | Schweitzer, III |
| 8,735,798 B2 | 5/2014 | Kesler |
| 8,803,069 B2 | 8/2014 | Kesler |
| 9,046,391 B2 | 6/2015 | Schweitzer, III |
| 9,515,475 B2 | 12/2016 | Kesler |
| 9,653,904 B2 | 5/2017 | Schweitzer, III |
| 2003/0205460 A1 | 11/2003 | Buda |
| 2004/0054921 A1 | 3/2004 | Land |
| 2004/0125532 A1 | 7/2004 | Schweitzer |
| 2005/0203672 A1 | 9/2005 | Restrepo |
| 2006/0261259 A1 | 11/2006 | Beinhocker |
| 2007/0014060 A1 | 1/2007 | Land |
| 2007/0070568 A1 | 3/2007 | Potter |
| 2007/0108986 A1 | 5/2007 | Moore |
| 2007/0132458 A1 | 6/2007 | Allen, Jr. |
| 2007/0242402 A1 | 10/2007 | Papallo |
| 2008/0004853 A1 | 1/2008 | Radibratovic |
| 2008/0094612 A1 | 4/2008 | Land |
| 2008/0170344 A1 | 7/2008 | Byron |
| 2008/0239592 A1 | 10/2008 | Roscoe |
| 2009/0161272 A1 | 6/2009 | Asokan |
| 2009/0189615 A1 | 7/2009 | Kinsel |
| 2010/0026425 A1 | 2/2010 | Roscoe |
| 2010/0328824 A1* | 12/2010 | Roscoe ............... H02H 1/0023 |
| | | 324/536 |
| 2012/0002195 A1 | 1/2012 | Wu |
| 2012/0312977 A1 | 12/2012 | Schweitzer, III |
| 2018/0013496 A1* | 1/2018 | Liu ..................... H04B 10/116 |

FOREIGN PATENT DOCUMENTS

| | | |
|---|---|---|
| EP | 1646119 | 4/2006 |
| EP | 3 306 764 | * 4/2018 |
| WO | 8808217 | 10/1998 |
| WO | 0221657 | 3/2002 |

OTHER PUBLICATIONS

IEEE 1584a, IEEE Guide for Performing Arc-Flash Hazard Calculations—Amendment 1, IEEE Industry Applications Society, Nov. 29, 2004.

VAMP Arc Protection Series, VAMP 121, VAMP 221, Jun. 24, 2008.

CEE Relays Ltd. "UTU Arc Protection Systems—a possibility to be protected", Feb. 27, 2002.

George Roscoe, Marcelo E. Valdes, Ray Luna, Methods for Arc-Flash Detection in Electrical Equipment, Petroleum and Chemical Industry Conference, 2010 Record of Conference Papers Industry Applications Society, Sep. 20-22, 2010.

Kevin Lippert, Donald M. Colaberardino, Clive W. Kimblin, Understanding IEEE 1584 Arc Flash Calculations, IEEE Industry Applications Magazine, May 2005.

Abb, Arc Protection Relay, Product Guide REA 10_, Jun. 22, 2005.

Abb, Arc Protection System REA, Jun. 2005.

Robert Wilson, Rainer Harju, Juha Keisala, Sethuraman Ganesan, Tripping with the Speed of Light: Arc Flash Protection, Mar. 27, 2007.

Meyle, LBW21 Arc Detection System Operating Instruction, Dec. 2004.

* cited by examiner

ARC-FLASH SENSOR USING OPTICAL FIBER

BACKGROUND

This disclosure relates to optical sensing devices used to provide improved remote sensing and protection. More particularly, the subject matter is related to fiber-optic sensors for providing improved arc-flash detection to protect electrical workers and equipment and prevent power outage in arc-flash events.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of any kind.

Electrical workers are qualified technicians who have skills and knowledge related to construction, installation, maintenance, and/or operation of electrical equipment that conduct, control, convert, distribute, generate, measure, rectify, store, transform, or transmit electrical energy. During manufacturing test, installation, and operation of electrical equipment, the electrical workers may perform live-line working involving maintenance of the electrical equipment operating at certain voltage while the electrical equipment is energized. Live-line maintenance techniques are used to perform periodic maintenance on electrical equipment involved while avoiding the power disruption and excessive costs related to power outage. Under certain circumstances, arc-flash events may occur during an electrical fault or a short circuit condition. The arc-flash events may be initiated by accidental contact with electrical equipment or power lines, equipment having short circuit current (e.g., due to contamination or tracking over insulated surfaces, deterioration or corrosion of equipment parts), as well as other causes. Arc flashes may release a large amount of energy in the form of excessive light, heat, sound, and/or pressure wave in a short time period.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In a first embodiment, a system is provided. The system includes an arc-flash sensor package and a fiber-optic cable. The arc-flash sensor package includes a lens to receive light from an arc-flash and a mounting system that has multiple configurations enabling the arc-flash sensor package to be mounted in a surface-mounted orientation or a peek-through orientation. The fiber-optic cable receives light from the lens. The fiber-optic cable enters the arc-flash sensor package substantially perpendicular to a principal axis of the lens.

In a second embodiment, an arc-flash sensor is provided. The arc-flash sensor includes a translucent optical lens and a fiber-optic cable. The translucent optical lens diffusively transmits light produced by an arc flash from a first side of the arc-flash sensor. The light is received by the fiber-optic cable that is substantially perpendicular to the first side and parallel to a surface on which the arc-flash sensor is mounted. The arc-flash sensor also includes a skirt covering a portion of the translucent optical lens to block light from entering the arc-flash sensor via a second side of the arc-flash sensor.

In a third embodiment, a system is provided. The system includes an arc-flash detection system and a power protection system. The arc-flash detection system includes a lens receiving light from an arc flash. The arc-flash detection system also includes a mounting system that has multiple configurations allowing an arc-flash sensor package to be mounted in a surface-mounted orientation to receive the light from a side opposite of a surface on which the arc-flash sensor package is mounted, or in a peek-through orientation to receive the light through the surface. The arc-flash detection system also includes a fiber-optic cable receiving light from the lens. The fiber-optic cable enters the arc-flash sensor package substantially perpendicular to a principal axis of the lens. The power protection system initiates protection procedures based at least in part on detection of the arc flash.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Certain examples commensurate in scope with the originally claimed subject matter are discussed below. These examples are not intended to limit the scope of the disclosure. Indeed, the present disclosure may encompass a variety of forms that may be similar to or different from the examples set forth below.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

An arc flash is an electrical discharge that results from a low-impedance connection, produces light and heat. Arc flashes may develop when the insulation (e.g., air) between conductors is broken down sufficiently to leave an ionized channel that may carry electrical current. In an arc-flash event, a flashover of electric current leaves its intended path and travels through the air from one conductor to another or to ground. During the arc-flash event, the air between conductors may be sufficiently heated to become ionized so that the air becomes conductive. Arc-flash events may cause excessive heat, ultraviolet radiation, blast pressure, flying debris, and/or excessive sound waves. The resulting release of arc-flash energy, referred to as "incident energy," is a measure of thermal energy at a working distance from an arc fault.

The goal of arc-flash mitigation is to reduce the arc-flash energy, therefore lowering the actual arc-flash level. Arc-flash mitigation may depend on fast arc-flash detection (e.g., using light sensing, pressure sensing, acoustic sensing, or any other appropriate sensing) and corresponding arc-flash protection procedures (e.g., fast tripping with high-speed protection relays).

With this in mind, an arc-flash sensor, as described in the present disclosure, may provide flexibilities for supporting both surface mounting and peek-through mounting on a panel (e.g., a wall panel or an electrical panel). With surface mounting, the arc-flash sensor may be used to detect an arc-flash has occurred within an enclosure in which the arc-flash sensor is mounted, and with peek-through mounting, the arc-flash sensor may detect arc-flash through a surface to which the arc-flash sensor is mounted. As discussed in more detail below, the arc-flash sensor may include a translucent optical lens, a fiber-optic cable, and a skirt covering the back of the optical lens. The translucent optical lens may diffuse the light produced in an arc flash to enhance the detectability of light signals picked by the arc flash sensor via the fiber-optic cable. The fiber-optic cable enters parallel to the panel and perpendicular to principal axis of the translucent optical lens. The parallel fiber-optic cable configuration reduces sensor installation space occupied and potential damage to the sensor. The skirt is used to prevent false tripping caused by events on the fiber-optic cable side of an aperture where the events may include camera flashes, lightning, sunlight, or the like. In some embodiments, multiple arc-flash sensors may be used in an area divided into a number of zones. Each arc-flash sensor may be used to detect arc-flash event in a respective zone. The skirt may be used to prevent false tripping caused by an arc-flash event occurring in a neighboring zone.

The embodiments of the present disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, for the sake of brevity and clarity, well-known features, structures, or operations are not shown or described in detail. Furthermore, the described features, structures, or operations may be combined in any suitable manner in one or more embodiments. It will also be readily understood that the components of the embodiments as generally described and illustrated in the figures herein may be arranged and designed in a wide variety of different configurations.

Figure 1:
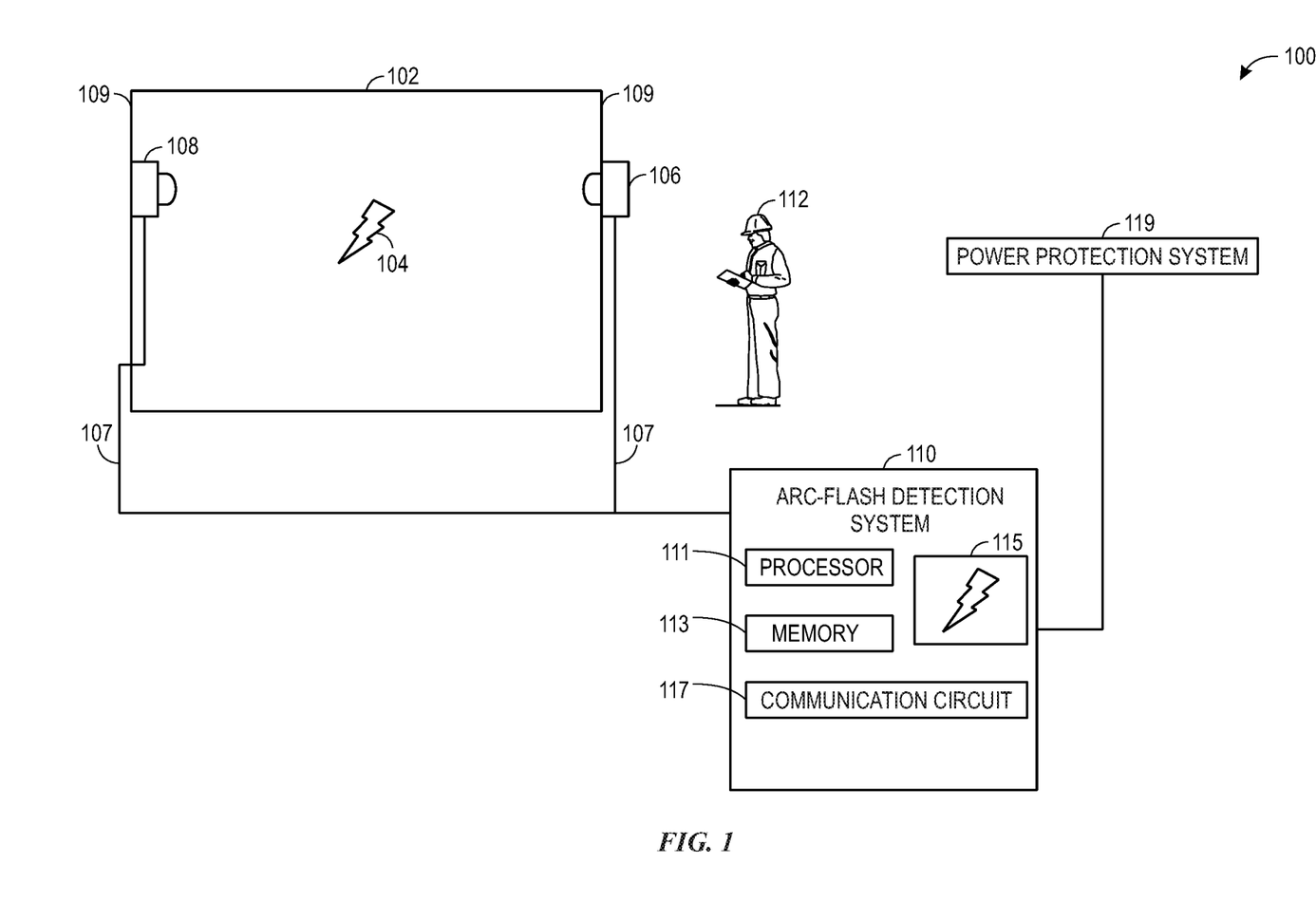
FIG. 1 illustrates an arc-flash detection system, in accordance with an embodiment.

With the forgoing in mind, turning now to the figures, FIG. 1 illustrates an arc-flash detection system 100. The arc-flash detection system 100 may be deployed to an area 102 where an arc flash 104 may occur. The arc flash 104 may be detected by a peek-through arc-flash sensor 106 and/or a surface-mount arc-flash sensor 108. The peek-through arc-flash sensor 106 and the surface-mount arc-flash sensor 108 may be similarly structured with a versatile design that enables a single arc-flash sensor to be mounted in a surface-mount configuration or a peek-through configuration. The peek-through arc-flash sensor 106 and the surface-mount arc-flash sensor 108 may be coupled to an arc-flash detection system 110. The arc-flash detection system 110 may receive detected signals from the arc flash 104 via fiber-optic cable(s) 107. The arc-flash detection system 110 may further process the received signals. The signal processing may include signal converting, monitoring, analyzing, displaying, and so on. The processed signals may be used by an electrical worker 112 who may perform live-line working involving maintenance of energized electrical equipment operating in the area 102 and/or any other actions in the area 102. Using the peek-through arc-flash sensor 106 and/or the surface-mount arc-flash sensor 108 to detect the arc flash 104 may reduce the possibility of being exposed to an arc-flash.

The area 102 may include a work area (e.g., a switch room or a control room) and/or a relatively confined area (e.g., a breaker compartment or a switchgear). The area 102 may have one or more boundaries 109, such as wall panels or electrical panels, to which the peek-through arc-flash sensor 106 and/or the surface-mount arc-flash sensor 108 may be installed. The area 102 may contain various pieces of electrical equipment and/or components, including but not limited to, power conducting equipment/components that conduct or interrupt the flow of electrical power, such as switches, circuit breakers, fuses, and lightning arrestors. Additionally, or alternatively, the area 102 may include control equipment/components that monitor, control, and protect the power-conducting components, such as control panels, current transformers, potential transformers, protective relays, and associated circuitry.

As mentioned previously, an arc-flash event (e.g., the occurrence of the arc flash 104) may be caused by numerous situations, such as a shorting of two electrical phases, which may create a phase-to-phase fault. Possible causes of phase-to-phase faults may include dropped tools, accidental contact by maintenance personnel, buildup of corrosion or conductive dust on conductors, and presence of pests (e.g., mice, rats, or snakes) that may be in contact with energized conductors. The formation (including magnitude and duration) of the arc flash 104 may depend on the following factors: an air gap from using air as an insulator or from a damaged insulator; available energy (e.g., fault current available from a power source) to initiate and sustain the arc-flash event; and some triggering event such as an accidental contact by a rodent acting as a conductor across the energized phase conductors.

For example, while the air is generally a good electrical insulator under normal conditions, if air is heated and becomes ionized, the air may change to a conductor, resulting in an arc-flash event. In certain environments with air gaps, such as in an electrical switchgear, arc-flash may occur with exposed copper or aluminum conductors (e.g., a busbar, conductors on the motor contactor, or breaker contacts).

Light (including visible and ultraviolet lights) may be produced from the arc flash 104. For example, in a relatively small arc-flash event (e.g., with a 2000 amp current), measured arc-flash light intensity may be 2,000,000 lux or twenty times brighter than sunlight at a distance of 1 meter from the arc-flash source. For larger arcing currents (e.g., with arcing currents higher than 17000 amp current), measured arc-flash light intensities may be greater than 12,000,000 lux that is equivalent to 120 times greater than sunlight at a distance of 1 meter from the arc-flash source. The arc-flash light may provide certain guidance to the electrical workers (e.g., the electrical worker 112) to better determine whether energized electrical equipment has experienced an arc flash and may be in a fault state without being exposed to an arc-flash (e.g., physically entering the area 102).

Besides light, other forms of energy may be released or produced during an arc flash, such as electromagnetic waves, heat, sound, and pressure waves. Some of these forms of energy can also be used to provide additional guidance to the electrical workers to determine whether an energized electrical equipment has experienced an arc flash and may be in a fault state. For example, electrical sensors may be used to detect the electromagnetic waves released by the arc flash. In some cases, heat signatures of the arc flash may be captured by temperature sensors or a high-speed infrared camera. In other cases, acoustic sensors or pressure sensors may be used to detect the occurrence of sound or pressure waves of the arc-flash event. However, in at least some deployments, these additional arc-flash detection sensors may have various limitations regarding to reliability, sensitivity, and validity. Therefore, in some embodiments, these other sensor types may be used as secondary or supplementary measures in addition to the primary light sensing method using the optical sensors (e.g., the peek-through arc-flash sensor 106 and the surface-mount arc-flash sensor 108). For example, electrical sensors may be susceptible to errors caused by interference (e.g., radio frequency interference (RFI) or electromagnetic interference (EMI)). In comparison to the electrical sensors, the optical sensors may be resistant to RFI/EMI. Furthermore, the acoustic sensors or pressure sensors may be challenging to test during installation.

The peek-through arc-flash sensor 106 and the surface-mount arc-flash sensor 108 illustrated in FIG. 1 are passive fiber-optic sensors using an optical lens to diffuse the arc-flash light to ensure that the arc-flash light is picked up by optical fibers enclosed in fiber-optic cables (details will be described later). The selection of the arc-flash sensor type(s) may be determined by users, such as choosing peek-through arc-flash sensor 106, the surface-mount arc-flash sensor 108, or a combination thereof. For instance, some customers may select the peek-through arc-flash sensor 106 that allows installing arc-flash sensors outside a primary arc-flash zone (e.g., the area 102).

The arc-flash detection system 110 may include a processor 111 and a memory 113. The memory 113 may contain instructions for the execution of the arc-flash detection and relevant calculations that are to be performed by the processor 111. The processor 111 may execute the instructions that are stored in the memory 113. For example, when the electrical equipment and/or components in area 102 are energized, the arc-flash detection system 110 may send commands to activate the arc-flash detection system 110 to start detecting possible arc-flash events using the light sensing method described above. In some embodiments, certain calculations may be related to determining the arcing current in the detected arc-flash event using the optical sensors (e.g., the peek-through arc-flash sensor 106 and the surface-mount arc-flash sensor 108). For example, the determined arcing current associated with medium-voltage equipment (e.g., 5 kV to 15 kV) may be slightly less than a bolted fault current, which is the maximum available fault current at some point in an electrical system. In low-voltage equipment (e.g., 480 V) the arcing current may be 60 percent of the bolted fault current. In one embodiment, the arc-flash detection system 110 may use an IEEE 1584 interface that includes equation(s) for calculating the arcing current.

Further, the arc-flash detection and calculations performed by the processor 111 may be accessible to the electrical worker 112 via one or more notification units 115. For example, the arc-flash detection system 110 may provide visual, vibrational, and/or auditory displays/indications/alerts in response to the detected arc-flash events. The one or more notification units 115 may include a display unit for providing the visual indications and/or alerts, a haptic motor for providing the vibrational indications and/or alerts, and/or a speaker for providing the audio indications and/or alerts. Further, the arc-flash detection system 110 may send the detected and processed signals associated with the arc flash events, via communication circuitry 117, to a power protection system. The communication circuitry 117 may be configured to communicate with the power protection system through a wired and/or wireless connection. The power protection system 119 may initiate corresponding arc flash related protection procedures (e.g., fast tripping using high-speed protection relays).

Figure 2:
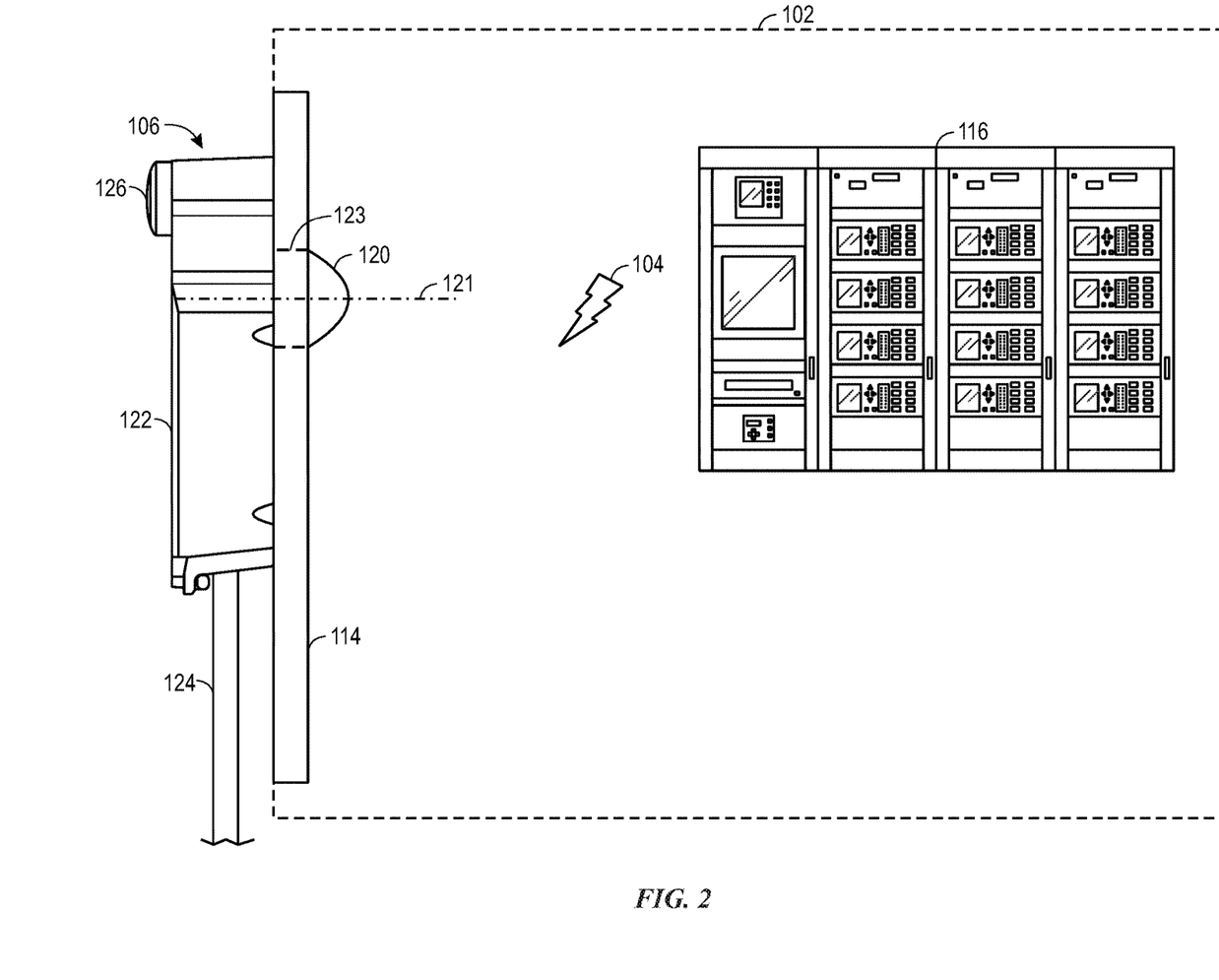
FIG. 2 illustrates a diagram of a peek-through arc-flash sensor of the arc-flash detection system of FIG. 1, in accordance with an embodiment.

FIG. 2 is a perspective view of the peek-through arc-flash sensor 106 described in the arc-flash detection system 100. The boundary 109 may include a panel 114 through which the peek-through arc-flash sensor 106 detects flashes in the area 102. The area 102 may contain electrical equipment 116 (e.g., switches, circuit breakers, fuses, and lightning arrestors, control panels, current transformers, potential transformers, protective relays, associated circuitry, and the like). Under certain circumstances, an arc-flash event may occur during an electrical fault or a short circuit condition associated with the electrical equipment 116. The resulting arc flash 104 may release, in a short time period, large amount of energy in various forms including the arc-flash light.

The peek-through arc-flash sensor 106 may include a lens 120, a fiber-optic cable 124, and a skirt 122 around the back of the peek-through arc-flash sensor 106. The lens 120 diffuses the arc-flash light produced by the arc flash 104. The diffusively transmitted arc-flash light may improve the detectability of light signals picked by the optical fiber(s) enclosed in the fiber-optic cable 124. A hole 123 may be drilled or otherwise provided in the panel 114 to guide the light guide 120 through the panel 114. As illustrated, the fiber-optic cable 124 enters parallel to the panel 114 and perpendicular to principal axis 121 of the lens 120.

In some embodiments, the lens 120 may be a light guide that diffusively transmits the arc-flash light produced by the arc flash 104. The light guide may be any type of suitable optical unit that may direct light from one place to another in a manner of diffusive scattering and/or reflecting.

Some arc-flash sensors may use fiber-optic cables routed perpendicular to the installation panel (e.g., the panel 114). However, such perpendicular fiber-optic cable configuration may lead to inconvenient arc-flash sensor installations that may extend out further from the panel 114. Eliminating or reducing such protrusions may decrease the possibility of damage to the flash sensor due to accidental contact with the fiber-optic cables on the back side of the installation panel.

As previously noted, the skirt 122 may be used to prevent false positives caused by flash events on the fiber-optic-cable-side of the panel 114. Additionally, the peek-through arc-flash sensor 106 may include mounting accessories 126 to secure the peek-through arc-flash sensor 106 onto the panel 114. The mounting accessories 126 may include metal and/or plastic screws, anchors, clips, and/or any mechanism suitable for fastening the peek-through arc-flash sensor 106 to the panel 114.

The peek-through arc-flash sensor 106 may be installed at a location on the panel 114 close to the potential sources of arc flashes (e.g., the electrical equipment 116). The location may be chosen so that potential arc-flash light can reach the lens 120 without being overly obscured by other equipment or objects inside the area 102.

Figure 3:
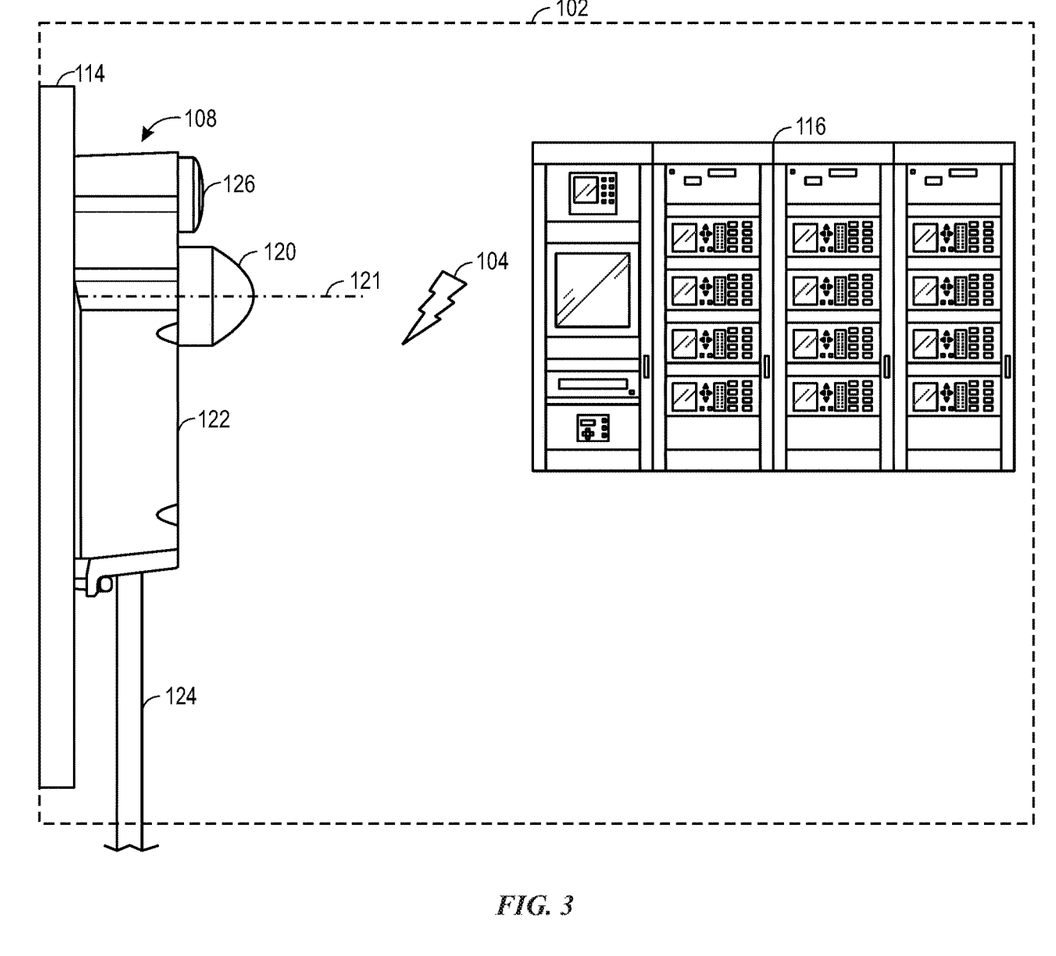
FIG. 3 illustrates a diagram of a surface mount arc-flash sensor of the arc-flash detection system of FIG. 1, in accordance with an embodiment.

Additionally or alternatively to detecting an arc-flash event using an arc-flash sensor mounted using a peek-through mount (e.g., the peek-through arc-flash sensor 106), FIG. 3 illustrates a diagram of the surface-mount arc-flash sensor 108 described in the arc-flash detection system 100. As previously noted, a single arc-flash sensor may be configured to be mounted with a peek-through mount or a surface mount. Thus, similar to the peek-through arc-flash sensor 106, the surface-mount arc-flash sensor 108 may include the lens 120 and the fiber-optic cable 124. However, the surface-mount arc-flash sensor 108 may be installed between the panel 114 and the electrical equipment 116, which may be different from the peek-through arc-flash sensor 106 that may be installed outside of the area 102). Accordingly, a hole may be drilled in the panel 114 to allow the fiber-optic cable 124 to pass through the panel 114. Similar to the peek-through arc-flash sensor 106, the lens 120 diffuses the arc-flash light produced by the arc flash 104, and the fiber-optic cable 124 is generally parallel to the panel 114 except at the locations around the pilot hole where the fiber-optic cable 124 enters the area 102.

As a comparison to the parallel fiber-optic cable configuration used in surface-mount arc-flash sensor 108, some market available arc-flash sensors use fiber-optic cables routed perpendicular to the installation panel (e.g., the panel 114). However, such perpendicular fiber-optic cable configuration may lead to arc-flash sensor installations that may extend out further from the panel 114 to space inside the area 102 that may not fit into certain installation locations. Eliminating or reducing such protrusions may decrease the possibility of damage to the flash sensor due to accidental contact with the fiber-optic cables while working inside the area 102.

In either sensor configuration (peek through or surface mount), the fiber-optic cable 124 is configured to enter the respective sensor package parallel to the panel 114 and perpendicular to the principal axis 121 of the lens 120. Since a single versatile sensor may be configured to surface-mount and peek-through configurations, the single versatile sensor may allow the arc-flash sensors to be reversible and flexible for better cable routing and monitor design for the area 102. The flexible cable routing may make the cable less likely to be damaged and the sensor have a smaller installation footprint regardless of the configuration in which the sensor is deployed. That is, using the fiber-optic cable 124 parallel to the installation panel 114 and perpendicular to the lens 120 makes the arc-flash sensor smaller, easier to route, and more flexible to mount.

Figure 4:
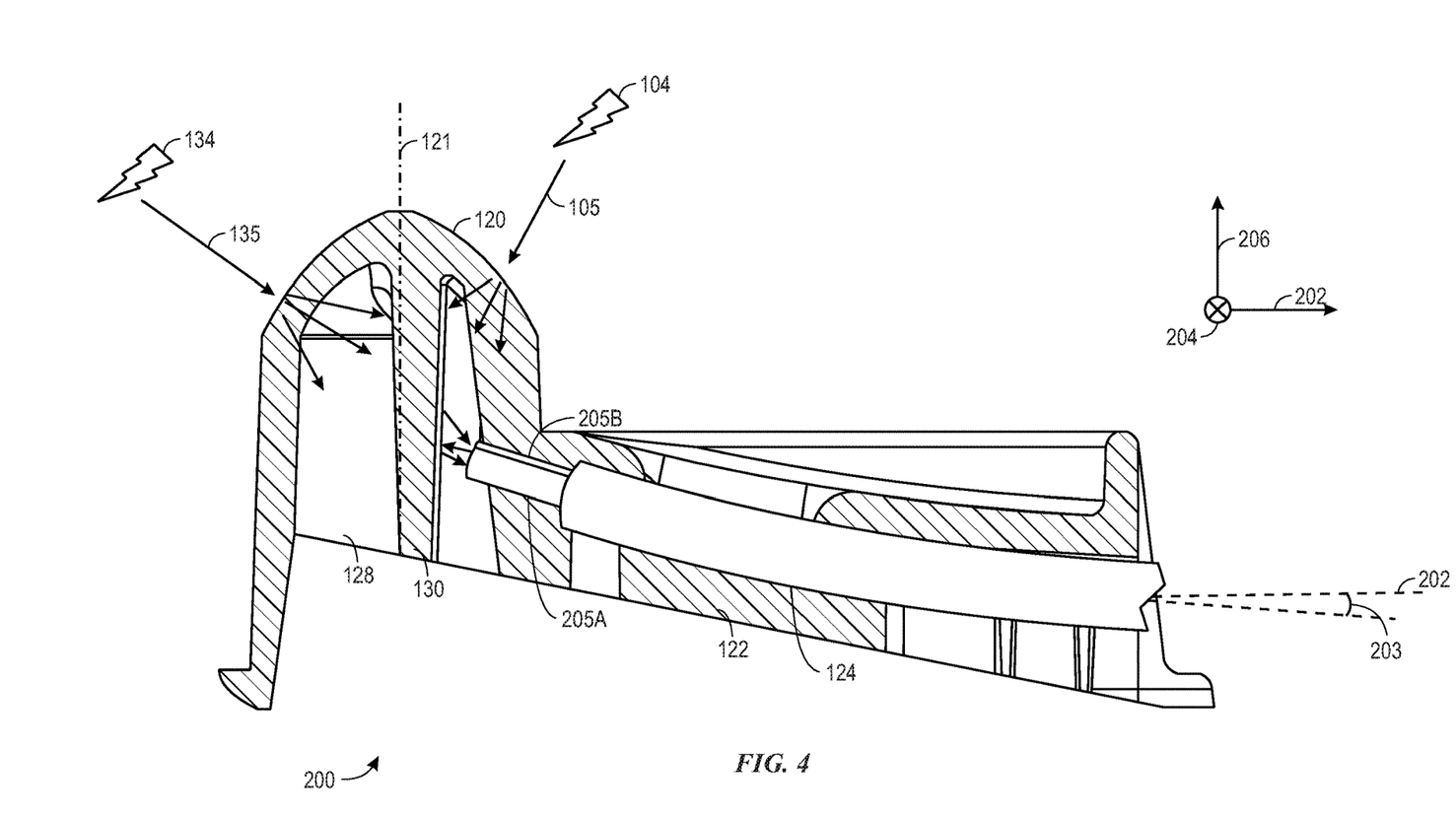
FIG. 4 illustrates a configuration diagram of an arc-flash sensor that may be used as the peek-through arc-flash sensor of FIG. 2, or the surface mount arc-flash sensor of FIG. 3, in accordance with an embodiment.

With the preceding in mind and to provide further familiarity with the arc-flash detection, FIG. 4 illustrates a configuration diagram of an arc-flash sensor that may be used as the peek-through arc-flash sensor 106 or the surface-mount arc-flash sensor 108. FIG. 4 is a cross-sectional view of the arc-flash sensor package 200 where the fiber-optic cable 124 enters the sensor package along an axis 202 and nearly perpendicular to principal axis 121 of the lens 120. A tilting angle 203 may be used to turn the fiber-optic cable 124 from the axis 202 closer to in-line with the principal axis 121. The tilting angle 203 curves the fiber-optic cable 124 to enable light from an arc flash to be more fully captured in the fiber-optic cable 124 from the area 102. However, in some embodiments, the tilting angle 203 may be relatively small (e.g., less than 15 degrees) causing the optical fibers 205 to enter the arc-flash sensor package 200 substantially perpendicular (e.g., within 15 degrees of perpendicular). The principal axis 121 is parallel to an axis 206 and perpendicular to both the axis 202 and an axis 204. The fiber-optic cable 124 may enclose one or more optical fibers 205, individually referred to as optical fibers 205A and 205B. The one or more optical fibers 205 are configured to capture arc-flash light collected by the lens 120.

Arc-flash light may enter the lens 120 from different angles and still be captured in the fiber-optic cable 124. For example, light 105 produced by the arc flash 104 may enter the lens 120 at an incident angle that is different from another incident angle at which light 135 produced by an arc flash 134 may enter the lens 120. The arc flash 104 and the arc flash 134 may occur at different locations in a three-dimensional space defined by a coordinate system formed by three axes 202, 204, and 206.

The arc-flash light (e.g., the light 105 and the light 135), when entering the lens 120, may be diffusively scattered (transmitted) through the lens 120 (or a separate diffusion layer), as shown in FIG. 4. The diffusion of light may be enabled by specific optical material of the lens 120 or a separate diffusion layer disposed on the lens 120. In certain embodiments, the lens 120 may be made of translucent or semi-translucent materials that allow a portion of the incident arc-flash light to transmit through the lens 120 in a diffuse scattering manner. The translucent or semi-translucent materials may include polycarbonates, Teflon, or other diffuse scattering materials.

A cavity 128 may be formed between the lens 120 and the optical fibers 205, as shown in FIG. 4. Some translucent or semi-translucent materials may have high diffuse reflectance so that the arc-flash light diffusively transmitted through the lens 120 may be diffusively reflected back and forth multiple times inside the cavity 128 until reaching an equilibrium or quasi-equilibrium of light intensity. Such diffuse scattering, combined with other specific design features (e.g., lens geometry) used to collect and direct light into the optical fibers 205, may allow the optical fibers 205 to sense the arc-flash light at a wide variety of incident angles (e.g., from 0 to 180 degrees) and to even out the sensitivity of the optical fibers 205 while sensing the arc flashes coming from different directions. Sensitivity tests, such as testing sensitivities with respect to different incident angles of the arc-flash light, will be described in detail later.

In some embodiments, the optical fibers 205 may include a primary optical fiber 205A to detect the arc-flash light diffusively scattered by the lens 120, and a secondary optical fiber 205B to enable a reflect-back function for continuity test. During the continuity test, the secondary optical fiber 205B injects light into the lens 120 where the light is reflected back into the primary optical fiber 205A. In other words, the optical fibers 205 may be used to test functionality of arc flash detection even in the absence of an arc flash in the area 102. When the diffusively scattered arc-flash light during a continuity test reaches a distal end of the secondary optical fiber 205B, a portion of the arc-flash light may be reflected back to the cavity 128 and/or a vertical portion 130. The vertical portion 130 may be made of the same or similar translucent material as the lens 120. Again, a portion of the arc-flash light that reaches the vertical portion 130 may be reflected back to the primary optical fiber 205A, which may be adjacent to the secondary optical fiber 205B. Thus, the secondary optical fiber 205B may be used for continuous test that may monitor/verify whether the primary optical fiber 205A is working properly when performing light sensing. The arc-flash detection system 110 may check the signals originated from the detected light by the primary optical fiber 205A at a specific time interval. The continuity test may be performed periodically (e.g., every 1 millisecond, 10 milliseconds, 100 milliseconds, 1 second, and so on) or performed on demand. If the continuity test indicates an issue with the primary optical fiber 205A, the arc-flash detection system 110 may switch to another arc-flash sensor (or a backup sensor) to ensure continuous monitoring and detection of arc-flash events. Additionally, or alternatively, the arc-flash detection system 110 may indicate that the arc-flash sensor package 200 is to be replaced after a failure of an arc-flash continuity test.

With the preceding in mind, an arc-flash sensor, such as the peek-through arc-flash sensor 106, the surface-mount arc-flash sensor 108, or the arc-flash sensor package 200 may sense a wide angle (e.g., 180 degrees) about an installation panel. As discussed below, the use of the arc-flash sensor package 200 presents a generally consistent sensitivity to different angles of incident. FIGS. 5-8 illustrate polar graphs representing sensitivity test results based on testing sensitivities with respect to different incident angles of the arc-flash light.

The sensitivity tests may be conducted by projecting light (in a similar wavelength range as the arc flashes) from different incident angles with respect to the to an arc-flash sensor package 200 and recording the detected light intensities. The resulting detected light intensity and the incident angle plot may be used to evaluate the sensitivity of detecting optical fibers in response to incident light projected from different directions around the arc-flash sensor package 200.

Figure 5:
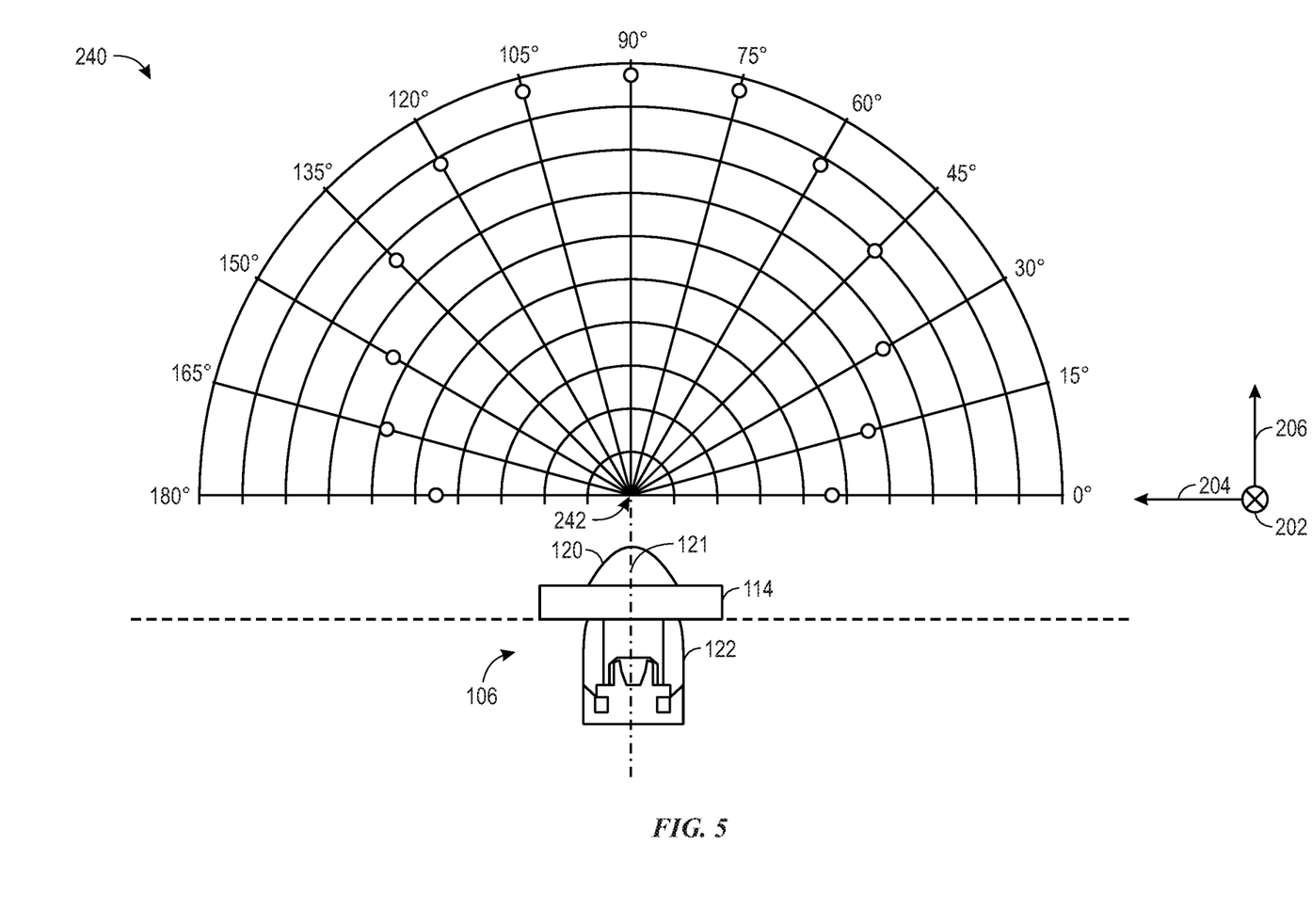
FIG. 5 illustrates results of a front sensitivity test using the peek-through arc-flash sensor of FIG. 2, in accordance with an embodiment.
Figure 6:
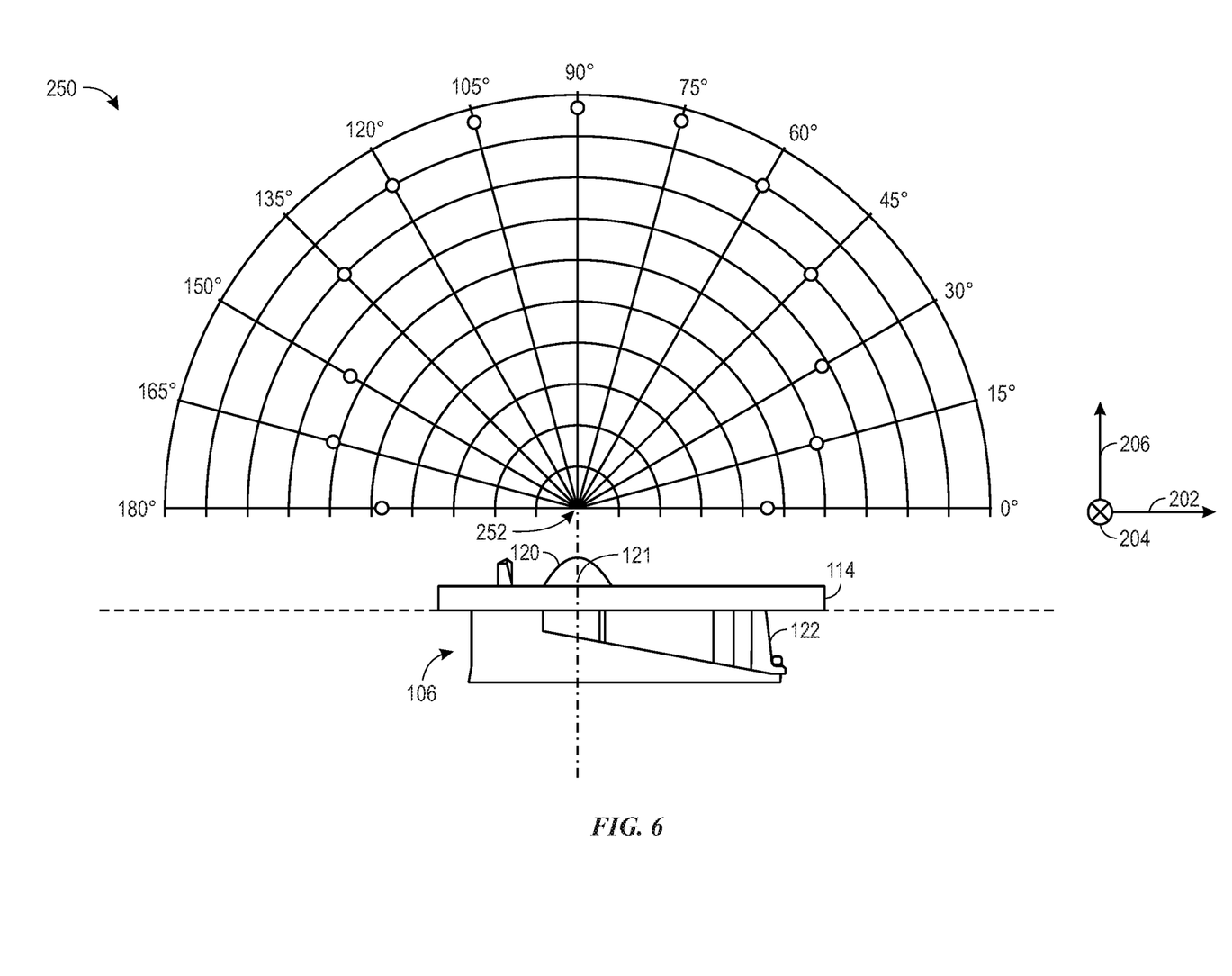
FIG. 6 illustrates results of a side sensitivity test using the peek-through arc-flash sensor of FIG. 2, in accordance with an embodiment.

FIGS. 5 and 6 show a polar coordinate graph with a distance from a reference point of the polar coordinate indicative of light intensity for a respective incident angle for a peek-through arc-flash sensor 106. The recorded light intensity values represented by dots at a series of incident angles, ranging from 0 degree to 180 degrees at an interval of 15 degrees, are plotted to show the sensitivities of the arc-flash sensor package 200 with respect to the incident light at different angles.

FIG. 5 shows a polar coordinate graph 240 that represents results from a front test where a top view of the peek-through arc-flash sensor 106 corresponds to a reference point 242 of the polar coordinate graph 240. The incident lights used for testing are within a plane (e.g., a horizontal plane) that is perpendicular to the axis 202, and parallel to the axes 204 and 206. The principal axis 121 and the axis 206 are perpendicular to the panel 114. As previously discussed, the fiber-optic cable 124 (not shown) enters the sensor package along the axis 202 and is parallel to the panel 114. The test results show that the detected light intensities are symmetrical with an ability to detect light from any angle within the area 102 for the plane analyzed by the test results.

FIG. 6 shows a polar coordinate graph 250 that represents results from a side test where a side view of the peek-through arc-flash sensor 106 corresponds to a reference point 252 for the polar coordinate graph 250. In comparison to FIG. 5, the incident light used for testing are within a different plane (e.g., a vertical plane) that is perpendicular to the axis 204, and parallel to the axes 202 and 206. That is, the incident plane in FIG. 6 is rotated by 90 degrees from the incident plane in FIG. 5. The test results are similar to the test result shown in FIG. 5, which shows that the diffuse scattering feature combined with specific lens geometry enable the arc-flash sensor package 200 to sense a wide range (e.g., 180 degrees) through the panel 114 for the plane (e.g., vertical plane).

Figure 7:
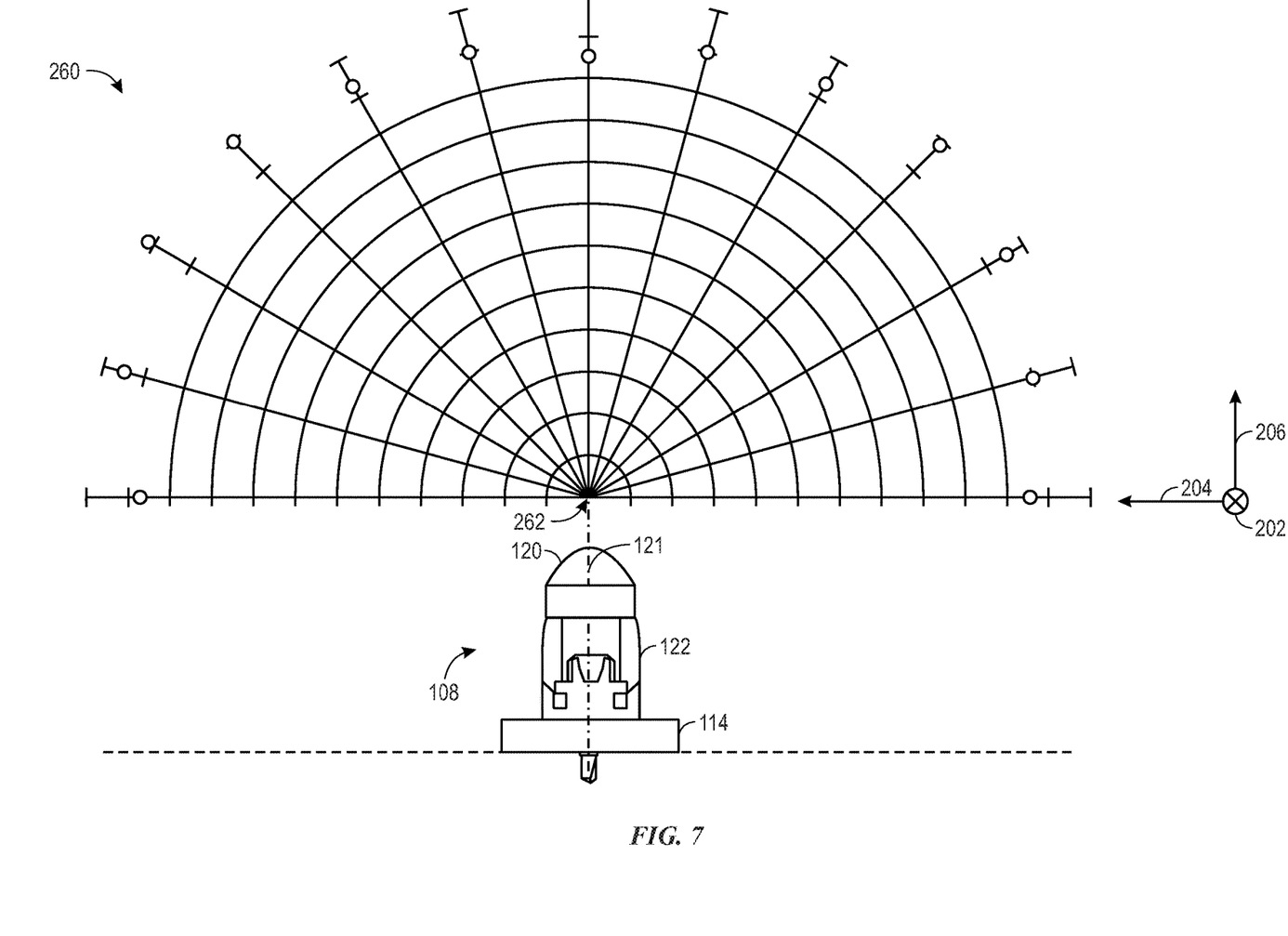
FIG. 7 illustrates results of a front sensitivity test using the surface mount arc-flash sensor of FIG. 3, in accordance with an embodiment.
Figure 8:
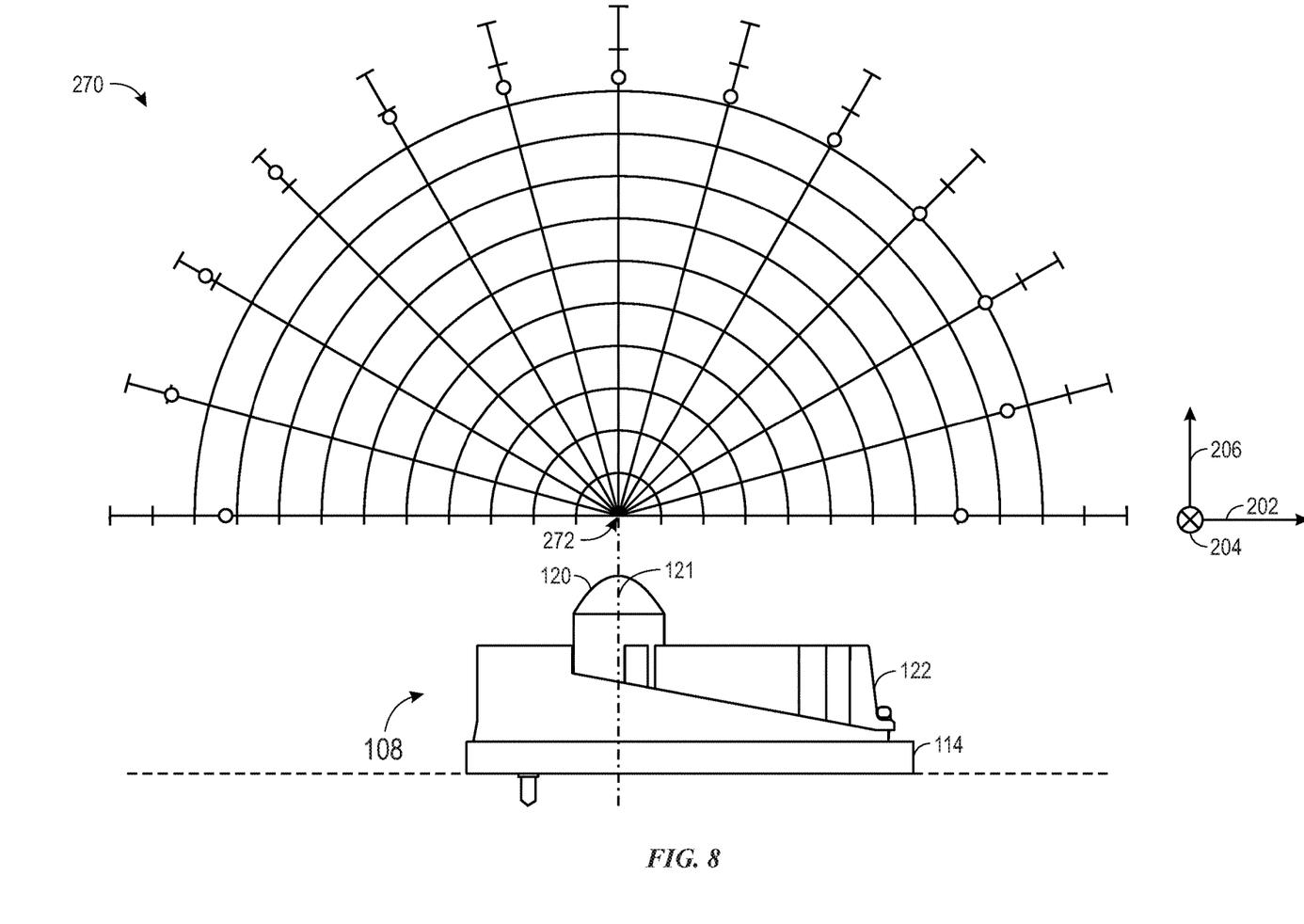
FIG. 8 illustrates results of a side sensitivity test using the surface mount arc-flash sensor of FIG. 3, in accordance with an embodiment.

FIGS. 7 and 8 show results from sensitivity tests using the surface-mount arc-flash sensor 108. Similar to FIGS. 5 and 6, FIGS. 7 and 8 show the recorded light intensity values represented by dots at a series of incident angles that are perpendicular to each other.

FIG. 7 shows a polar coordinate graph 260 that represents results from a front test, where a top view of the surface-mount arc-flash sensor that corresponds to a reference point 262 of the polar coordinate graph 260. The polar coordinate graph 260 uses the same plane (e.g., horizontal plane) used in the polar coordinate graph 240 of FIG. 5. Also, as previously noted, the fiber-optic cable 124 (not shown) enters the sensor package 200 along the axis 202 and parallel to the panel 114 regardless of the mount type. Similar to the results of the sensitivity test of the peek-through arc-flash sensor 106, the test results show that the detected light intensities of the surface-mount arc-flash sensor 108 are symmetrical with an ability to detect light from any angle within the area 102 for the analyzed plane.

FIG. 8 shows a polar coordinate graph 270 that represents results from a side test of the surface-mount arc-flash sensor 108 that corresponds to a reference point 272 of the polar coordinate graph 260. In comparison to FIG. 7, the incident light used for testing are within a different plane (e.g., vertical plane) from that used for the polar coordinate graph 260 but the same plane as used for the polar coordinate graph 250 that is perpendicular to the axis 204 and parallel to the axes 202 and 206. The test results are similar to the test result shown in FIG. 7, which shows that the diffuse scattering feature combined with specific lens geometry enable the arc-flash sensor package 200 to sense a wide range (e.g., 180 degrees) through the panel 114 for the plane (e.g., vertical plane)

Figure 9:
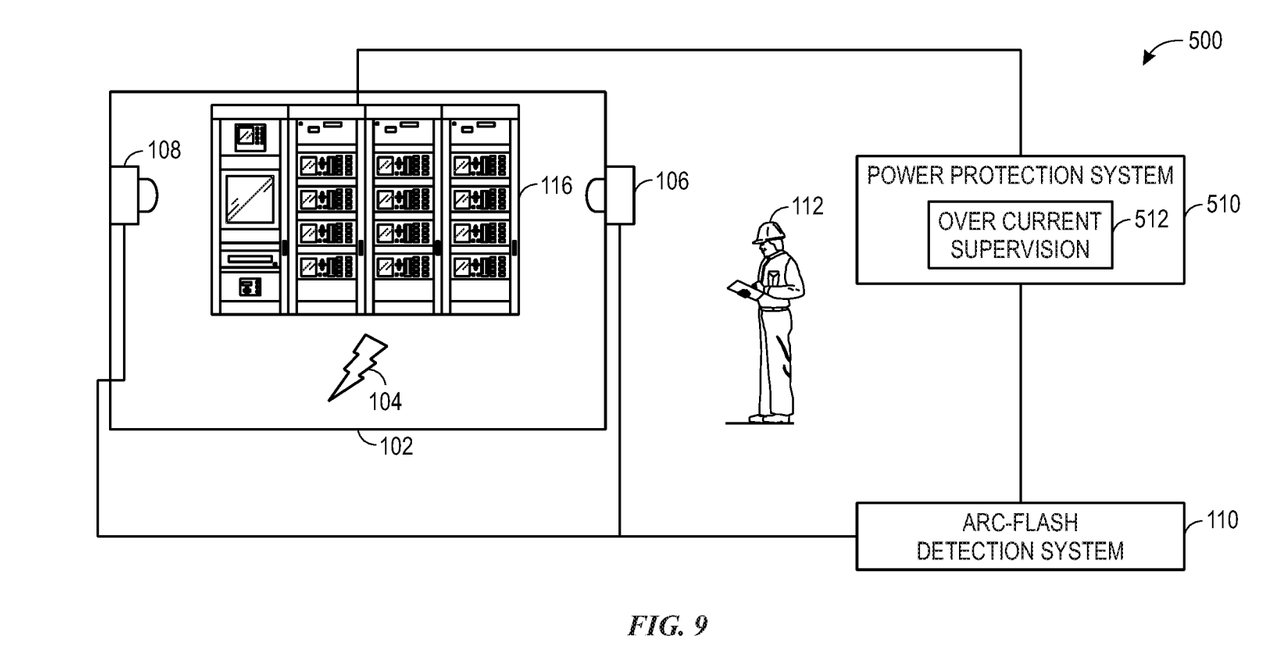
FIG. 9 illustrates an arc-flash detection and protection system, in accordance with an embodiment

Keeping the forgoing in mind, FIG. 9 illustrates an arc-flash detection and protection system 500. The arc-flash detection and protection system 500 may include the arc-flash detection system 110 and a power protection system 510. Using the peek-through arc-flash sensor 106, the surface-mount arc-flash sensor 108, and/or the arc-flash sensor package 200, the arc-flash detection system 110 may receive detected signals associated with the arc flash 104. The arc-flash detection system 110 may process the received signals, including but not limited to converting, monitoring, analyzing, and displaying the received signals.

Further, the arc-flash detection system 110 may send the detected and processed signals associated with arc flash 104, via certain wire/wireless communication circuitry and/or a transmitter, to the power protection system 510. The power protection system 510 may initiate corresponding arc flash related protection procedures (e.g., fast tripping using high-speed protection relays). During an arc-flash event, the arc-flash energy is proportional to the multiplications of a voltage across an electrical arc, an arcing current, and a duration of the arc-flash event. The voltage across the electrical arc may be determined by the conductor gap, and the arcing current may be limited by the available fault current. The protection relays may have little control over the voltage and current. What the protection relays may impact, however, is the duration of the arc-flash event. The faster the extinction of the arc-flash event, the smaller the amount of incident energy may be released. That is, decreasing the time that takes a protection relay to trip in response to an arc fault may reduce arc-flash incident energy.

The power protection system 510 may include an overcurrent supervision 512 to confirm or deny detected arc faults using optical detection. For example, an overcurrent element in a protection relay may be used to sense a current surge. If the electrical equipment 116 is exposed to a light source such as a camera flash, the incorrect detected signals transferred from arc-flash detection system 110 to the power protection system 510 may not trigger the protection relay to trip because the overcurrent element in the protection relay does not sense a current surge.

On the other hand, the overcurrent supervision mechanism may not be able to determine whether a detected current surge is caused by an arc-flash event or some other causes, such as an external fault on the feeder, an external fault on the protected equipment downstream, or a non-fault condition (e.g., transformer inrush or motor start inrush). The light sensing using light sensors may differentiate between an arc-flash event and other faults by sensing the light flash via light sensors. Combining light-sensing technology with fast overcurrent protection may provide secure high-speed arc-flash protections that may enable high-speed tripping during arc-flash events and prevent unintentional tripping caused by external faults.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform. Accordingly, many changes may be made to the details of the above-described embodiments without departing from the underlying principles of this disclosure. The scope of the present disclosure should, therefore, be determined only by the following claims.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. A system, comprising:
an arc-flash sensor package comprising:
a lens configured to receive light from an arc-flash; and
a mounting system that has multiple configurations comprising a first configuration that enables the arc-flash sensor package to be mounted in a surface-mounted orientation and a second configuration that enables the arc-flash sensor package to be mounted in a peek-through orientation; and
a fiber-optic cable configured to receive light from the lens, wherein the fiber-optic cable enters the arc-flash sensor package substantially perpendicular to a principal axis of the lens.

2. The system of claim 1, wherein the system comprises an additional fiber-optic cable to be used with the fiber-optic cable to perform continuity testing.

3. The system of claim 2, wherein the lens is configured to receive a continuity light signal from the additional fiber-optic cable and reflect the continuity light signal to the fiber-optic cable to detect continuity.

4. The system of claim 3, wherein a portion of the lens configured to reflect the continuity light is made of a same material as a remaining portion of the lens.

5. The system of claim 2, wherein the additional fiber-optic cable is parallel to the fiber-optic cable when entering the arc-flash sensor package.

6. The system of claim 1, wherein the lens comprises a translucent material.

7. The system of claim 6, wherein the translucent material comprises a polycarbonate material.

8. The system of claim 1, wherein the lens comprises a diffusion layer.

9. The system of claim 1, wherein the arc-flash sensor package comprises a skirt covering a back side of the lens.

10. The system of claim 9, wherein the skirt is configured to prevent false tripping caused by false flash events entering the arc-flash sensor package from the back side of the lens.

11. An arc-flash sensor, comprising:
a translucent optical lens configured to diffusively transmit light produced by an arc flash from a first side of the arc-flash sensor;
a fiber-optic cable configured to receive the light, wherein the fiber-optic cable is substantially perpendicular to the first side and parallel to a surface on which the arc-flash sensor is mounted, wherein the fiber-optic cable is configured to be parallel to the surface in a first configuration that enables the arc-flash sensor to be mounted in a surface-mounted orientation and configured to be parallel to the surface in a second configuration that enables the arc-flash sensor to be mounted in a peek-through orientation; and
a skirt covering a portion of the translucent optical lens to block light from entering the arc-flash sensor via a second side of the arc-flash sensor.

12. The arc-flash sensor of claim 11, wherein the translucent optical lens comprises a diffusion layer to diffusively transmit the light.

13. The arc-flash sensor of claim 11, comprising a cavity formed between the translucent optical lens and the fiber-optic cable.

14. The arc-flash sensor of claim 13, wherein the light diffusively transmitted through the translucent optical lens is diffusively scattered inside of the cavity.

15. The arc-flash sensor of claim 11, wherein the arc-flash sensor has a range of reception of the light from incident angles 0 to 180 degrees.

16. The arc-flash sensor of claim 11, comprising a mounting system configured to mount the arc-flash sensor to the surface using a peek-through orientation or using a surface-mounted orientation.

17. A system, comprising:
an arc-flash detection system, comprising:
a lens configured to receive light from an arc flash;
a mounting system that has multiple configurations comprising a first configuration that enables an arc-flash sensor package to be mounted in a surface-mounted orientation configured to receive the light from a side opposite of a surface on which the arc-flash sensor package is mounted and a second configuration that enables the arc-flash sensor package to be mounted in a peek-through orientation configured to receive the light through the surface; and
a fiber-optic cable configured to receive light from the lens, wherein the fiber-optic cable enters the arc-flash sensor package substantially perpendicular to a principal axis of the lens; and
a power protection system configured to initiate protection procedures based at least in part on detection of the arc flash.

18. The system of claim 17, wherein the arc-flash detection system comprises a continuity fiber-optic cable that is configured to transmit a continuity light signal to the lens, wherein the lens is configured to reflect the continuity light signal from the continuity fiber-optic cable to the fiber-optic cable.

19. The system of claim 17, wherein the power protection system is configured to confirm, using overcurrent detection, an existence of an arc event caused by the arc flash.

20. The system of claim 19, wherein the power protection system is configured to initiate protection procedures in response to confirming that the arc event is caused by the arc flash.

* * * * *